United States Patent
Sulfridge et al.

(10) Patent No.: US 11,942,498 B2
(45) Date of Patent: Mar. 26, 2024

(54) MICROLENSES FOR SEMICONDUCTOR DEVICE WITH SINGLE-PHOTON AVALANCHE DIODE PIXELS

(71) Applicant: SEMICONDUCTOR COMPONENTS INDUSTRIES, LLC, Phoenix, AZ (US)

(72) Inventors: Marc Allen Sulfridge, Boise, ID (US); Byounghee Lee, Meridian, ID (US); Ulrich Boettiger, Garden City, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 60 days.

(21) Appl. No.: 17/651,916

(22) Filed: Feb. 22, 2022

(65) Prior Publication Data
US 2022/0181373 A1    Jun. 9, 2022

Related U.S. Application Data

(63) Continuation of application No. 16/402,429, filed on May 3, 2019, now Pat. No. 11,289,524.
(Continued)

(51) Int. Cl.
*H01L 31/0232*    (2014.01)
*H01L 27/146*    (2006.01)
(Continued)

(52) U.S. Cl.
CPC .. *H01L 27/14627* (2013.01); *H01L 27/14685* (2013.01); *H01L 31/107* (2013.01);
(Continued)

(58) Field of Classification Search
None
See application file for complete search history.

(56) References Cited

U.S. PATENT DOCUMENTS

| | | | |
|---|---|---|---|
| 6,627,305 B1 * | 9/2003 | Deane | G02F 1/1333 257/E31.127 |
| 2005/0109916 A1 | 5/2005 | Parks | |

(Continued)

FOREIGN PATENT DOCUMENTS

EP    1201407 A2    5/2002

*Primary Examiner* — Joseph C. Nicely
*Assistant Examiner* — Lamont B Koo
(74) *Attorney, Agent, or Firm* — Treyz Law Group, P.C.; David K. Cole

(57) ABSTRACT

An imaging device may include a plurality of single-photon avalanche diode (SPAD) pixels. The SPAD pixels may be overlapped by square toroidal microlenses to direct light incident on the pixels onto photosensitive regions of the pixels. The square toroidal microlenses may be formed as first and second sets of microlenses aligned with every other SPAD pixel and may allow the square toroidal microlenses to be formed without gaps between adjacent lenses. Additionally or alternatively, a central portion of each square toroidal microlenses may be filled by a fill-in microlens. Together, the square toroidal microlenses and the fill-in microlenses may form convex microlenses over each SPAD pixel. The fill-in microlenses may be formed from material having a higher index of refraction than material that forms the square toroidal microlenses.

18 Claims, 11 Drawing Sheets

Related U.S. Application Data

(60) Provisional application No. 62/817,954, filed on Mar. 13, 2019.

(51) Int. Cl.
*H01L 31/107* (2006.01)
*H04N 25/50* (2023.01)
*H04N 25/702* (2023.01)
*H04N 25/75* (2023.01)

(52) U.S. Cl.
CPC ........... *H04N 25/50* (2023.01); *H04N 25/702* (2023.01); *H04N 25/75* (2023.01)

(56) References Cited

U.S. PATENT DOCUMENTS

| | | |
|---|---|---|
| 2017/0133420 A1 | 5/2017 | Silsby |
| 2017/0250218 A1 | 8/2017 | Parks |
| 2017/0347042 A1 | 11/2017 | Borthakur et al. |
| 2017/0366769 A1 | 12/2017 | Mlinar et al. |
| 2018/0269245 A1 | 9/2018 | Mlinar et al. |
| 2018/0329035 A1 | 11/2018 | Pacala et al. |
| 2019/0191067 A1 | 6/2019 | Vaillant et al. |

\* cited by examiner

MICROLENSES FOR SEMICONDUCTOR DEVICE WITH SINGLE-PHOTON AVALANCHE DIODE PIXELS

This application is a continuation of U.S. patent application Ser. No. 16/402,429, filed May 3, 2019, which claims the benefit of provisional patent application No. 62/817,954, filed Mar. 13, 2019, which are hereby incorporated by reference herein in their entireties

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals. Each pixel may also include a microlens that overlaps and focuses light onto the photosensitive element. Image sensors are sometimes designed to provide images to electronic devices using a Joint Photographic Experts Group (JPEG) format.

Conventional image sensors with backside-illuminated pixels may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. However, SPADs may require larger photosensitive regions than conventional image sensors and therefore may require thicker microlenses to focus light on the photosensitive elements within the SPADs. It may not be feasible or practical to create microlenses that are thick enough to focus light onto underlying SPAD pixels.

It would therefore be desirable to be able to provide improved microlenses for single-photon avalanche diode pixels.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices (such as the ones described in connection with FIGS. 1-4), on the other hand, the photon detection principle is different. The light sensing diode is biased slightly above its breakdown point and when an incident photon generates an electron or hole, this carrier initiates an avalanche breakdown with additional carriers being generated. The avalanche multiplication may produce a current signal that can be easily detected by readout circuitry associated with the SPAD. The avalanche process needs to be stopped (quenched) by lowering the diode bias below its breakdown point. Each SPAD may therefore include a passive and/or active quenching circuit for quenching the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
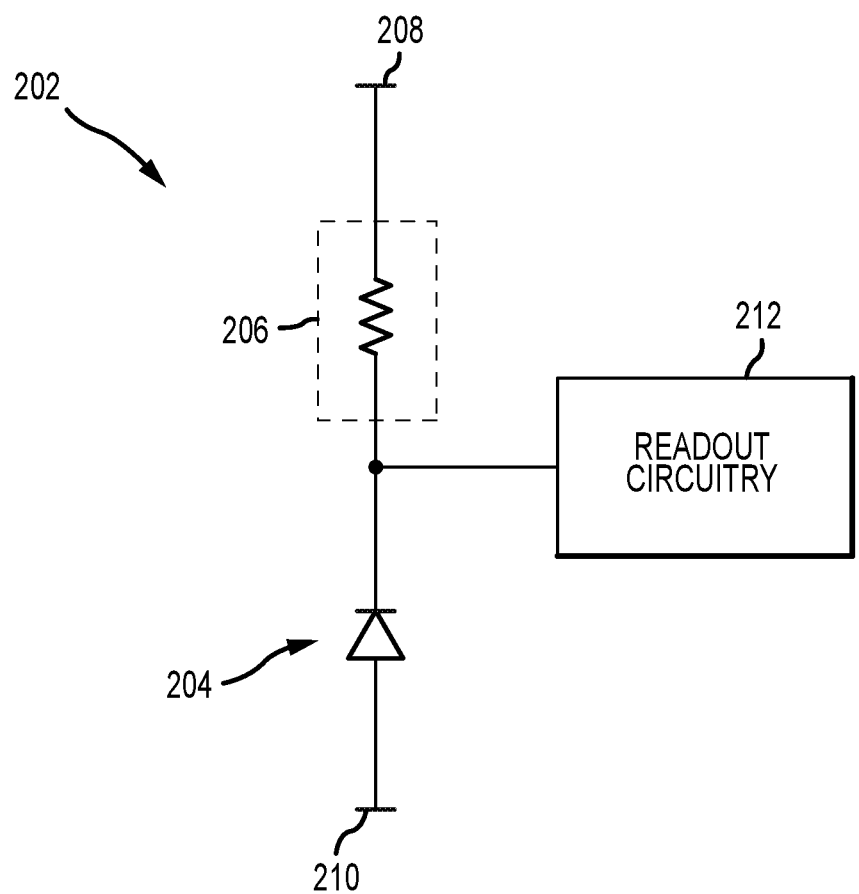
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 208 (e.g., a ground power supply voltage terminal) and a second supply voltage terminal 210 (e.g., a positive power supply voltage terminal). During operation of SPAD device 202, supply voltage terminals 208 and 210 may be used to bias SPAD 204 to a voltage that is higher than the breakdown voltage. Breakdown voltage is the largest reverse voltage that can be applied without causing an exponential increase in the leakage current in the diode. When SPAD 204 is biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor is used to form quenching circuitry 206. This is an example of passive quenching circuitry. After the avalanche is initiated, the resulting current rapidly discharges the capacity of the device, lowering the voltage at the SPAD to near to the breakdown voltage. The resistance associated with the resistor in quenching circuitry 206 may result in the final current being lower than required to sustain itself. The SPAD may then be reset to above the breakdown voltage to enable detection of another photon.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing.

In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect how many photons are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
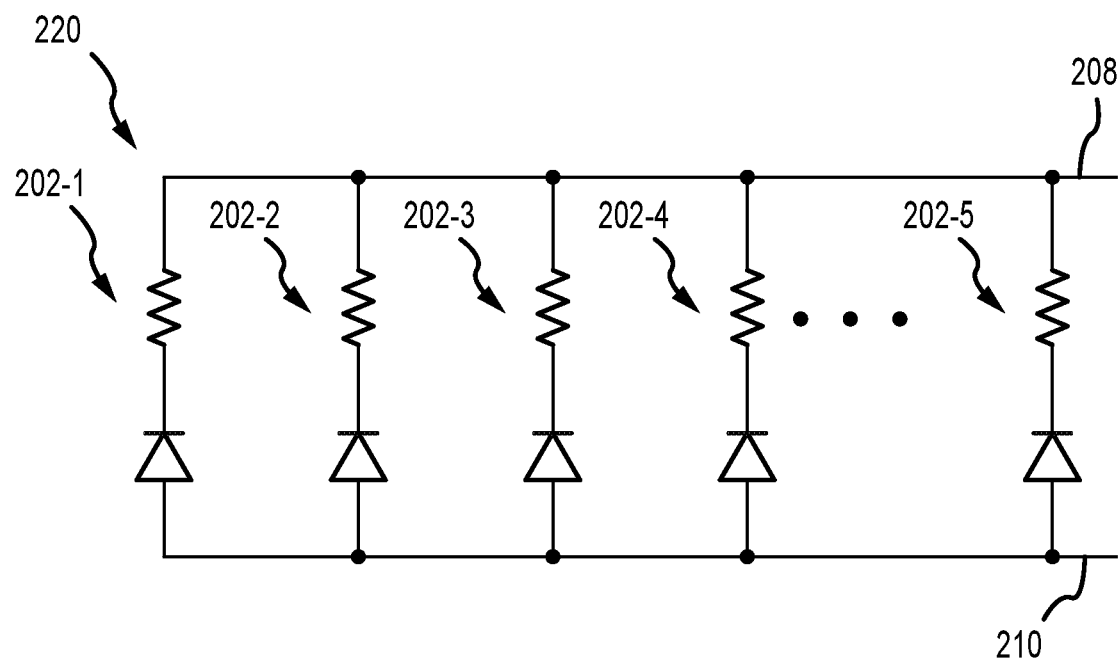
FIG. 2 is a diagram of an illustrative silicon photomultiplier in accordance with an embodiment.

Multiple SPAD devices may be grouped together to increase dynamic range. FIG. 2 is a circuit diagram of an illustrative group 220 of SPAD devices 202. The group of SPAD devices may be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier.

Herein, each SPAD device may be referred to as a SPAD pixel 202. Although not shown explicitly in FIG. 2, readout circuitry for the silicon photomultiplier may measure the combined output current from all of SPAD pixels in the silicon photomultiplier. In this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of a plurality of SPAD pixels having a common output in a silicon photomultiplier is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
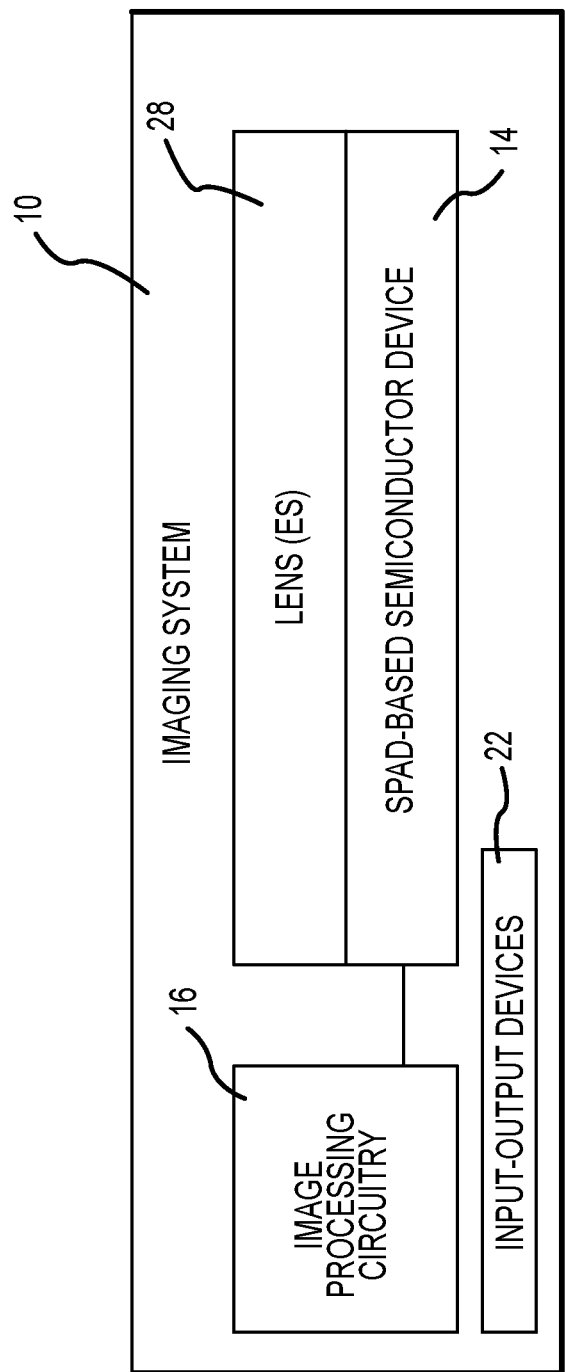
FIG. 3 is a schematic diagram of an illustrative imaging system with a SPAD-based semiconductor device in accordance with an embodiment.

An imaging system 10 with a SPAD-based semiconductor device is shown in FIG. 3. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more).

The SPAD-based semiconductor device 14 may optionally include additional circuitry such as bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component may be included in the imaging system to emit light (e.g., infrared light or light of any other desired type). Semiconductor device 14 may measure the reflection of the light off of an object to measure distance to the object in a LIDAR (light detection and ranging) scheme.

Figure 4:
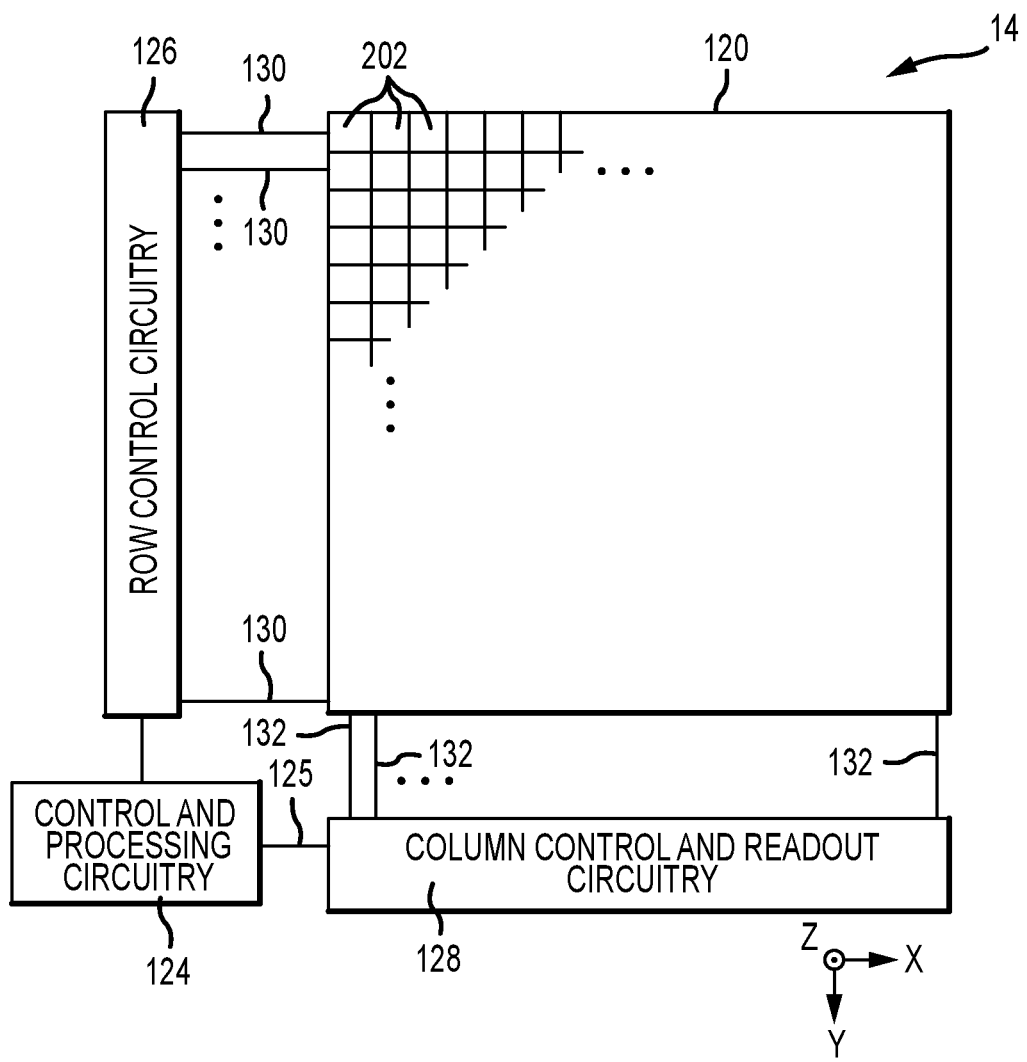
FIG. 4 is a diagram of an illustrative pixel array and associated readout circuitry for reading out image signals in a SPAD-based semiconductor device in accordance with an embodiment.

FIG. 4 shows one example for a semiconductor device 14 that includes an array 120 of SPAD pixels 202 (sometimes referred to herein as image pixels or pixels) arranged in rows and columns. Array 120 may contain, for example, hundreds or thousands of rows and columns of SPAD pixels 202. Each SPAD pixel may be coupled to an analog pulse counter that generates a corresponding pixel voltage based on received photons. Each SPAD pixel may additionally or instead be coupled to a time-of-flight to voltage converter circuit. In both types of readout circuits, voltages may be stored on pixel capacitors and may later be scanned in a row-by-row fashion. Control circuitry 124 may be coupled to row control circuitry 126 and image readout circuitry 128 (sometimes referred to as column control circuitry, readout circuitry, processing circuitry, or column decoder circuitry). Row control circuitry 126 may receive row addresses from control circuitry 124 and supply corresponding row control signals to SPAD pixels 202 over row control paths 130. One or more conductive lines such as column lines 132 may be coupled to each column of pixels 202 in array 120. Column lines 132 may be used for reading out image signals from pixels 202 and for supplying bias signals (e.g., bias currents or bias voltages) to pixels 202. If desired, during pixel readout operations, a pixel row in array 120 may be selected using row control circuitry 126 and image signals generated by image pixels 202 in that pixel row can be read out along column lines 132.

Image readout circuitry 128 may receive image signals (e.g., analog or digital signals from the SPAD pixels) over column lines 132. Image readout circuitry 128 may include sample-and-hold circuitry for sampling and temporarily storing image signals read out from array 120, amplifier circuitry, analog-to-digital conversion (ADC) circuitry, bias circuitry, column memory, latch circuitry for selectively enabling or disabling the column circuitry, or other circuitry that is coupled to one or more columns of pixels in array 120 for operating pixels 202 and for reading out signals from pixels 122. ADC circuitry in readout circuitry 128 may convert analog pixel values received from array 120 into corresponding digital pixel values (sometimes referred to as digital image data or digital pixel data). Alternatively, ADC circuitry may be incorporated into each SPAD pixel 202. Image readout circuitry 128 may supply digital pixel data to control and processing circuitry 124 and/or image processing and data formatting circuitry 16 (FIG. 1) over path 125 for pixels in one or more pixel columns.

The example of image sensor 14 having readout circuitry to read out signals from the SPAD pixels in a row-by-row manner is merely illustrative. In other embodiments, the readout circuitry in the image sensor may simply include digital pulse counting circuits coupled to each SPAD pixel. Any other desired readout circuitry arrangement may be used.

If desired, array 120 may be part of a stacked-die arrangement in which pixels 202 of array 120 are split between two or more stacked substrates. Alternatively, pixels 202 may be formed in a first substrate and some or all of the corresponding control and readout circuitry may be formed in a second substrate. Each of the pixels 202 in the array 120 may be split between the two dies at any desired node within pixel.

It should be understood that instead of having an array of SPAD pixels as in FIG. 4, SPAD-based semiconductor device 14 may instead have an array of silicon photomultipliers (each of which includes multiple SPAD pixels with a common output).

Figure 5:
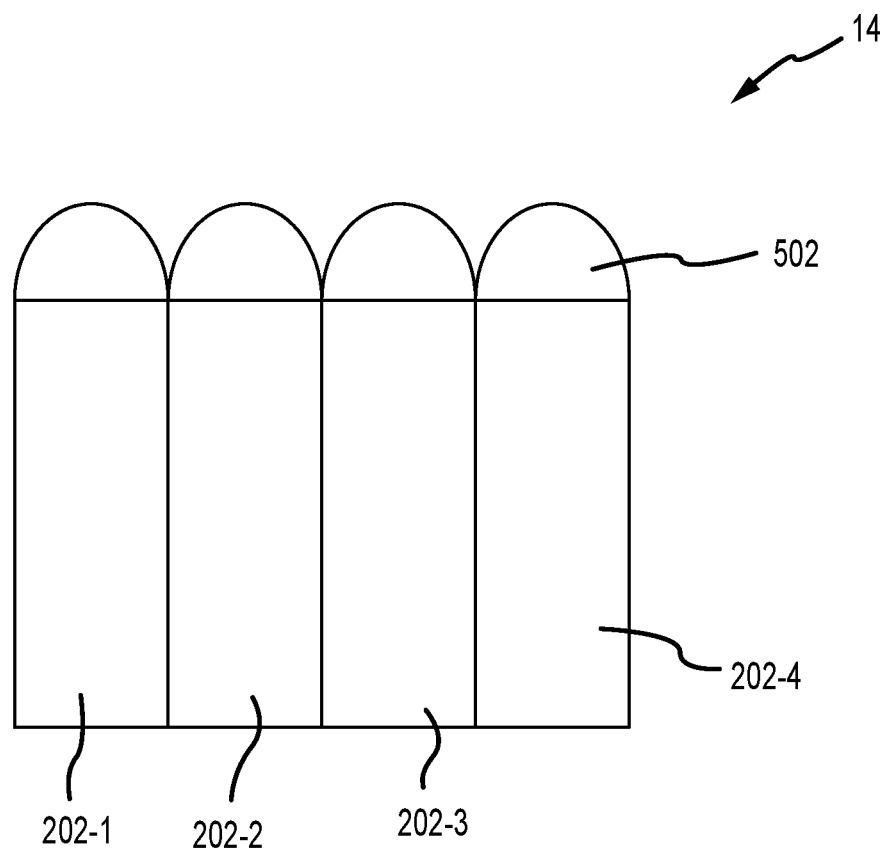
FIG. 5 is a cross-sectional diagram of illustrative SPAD pixels covered with spherical microlenses in accordance with an embodiment.

As shown in FIG. 5, each SPAD pixel 202 in a group 220 of SPAD devices (see FIG. 2) may be covered by a microlens 502 (alternatively, each SPAD pixel 202 in the array of SPAD pixels shown in FIG. 4 may be covered by a microlens 502). In particular, each microlens 502 may focus incident light on an associated one of SPAD pixels 202. In general, microlenses 502 may be any desired shape to focus the light as needed. However, because of the large photosensitive regions in SiPM devices, traditional spherical lenses, such as microlenses 502 of FIG. 5, may be too thin to focus light properly on the photosensitive regions when formed using conventional manufacturing methods and equipment. In particular, the SiPM devices may have SPAD pixels with pitches that are approximately between 20 microns and 35 microns wide. To focus light incident on image sensor onto the array of SPAD pixels, spherical microlenses with thicknesses of approximately 20 microns may be required. This is thicker than traditional microlenses, which may have thicknesses of approximately 5 microns, and standard equipment may therefore not be capable of forming microlenses for SiPM devices.

Figure 6:
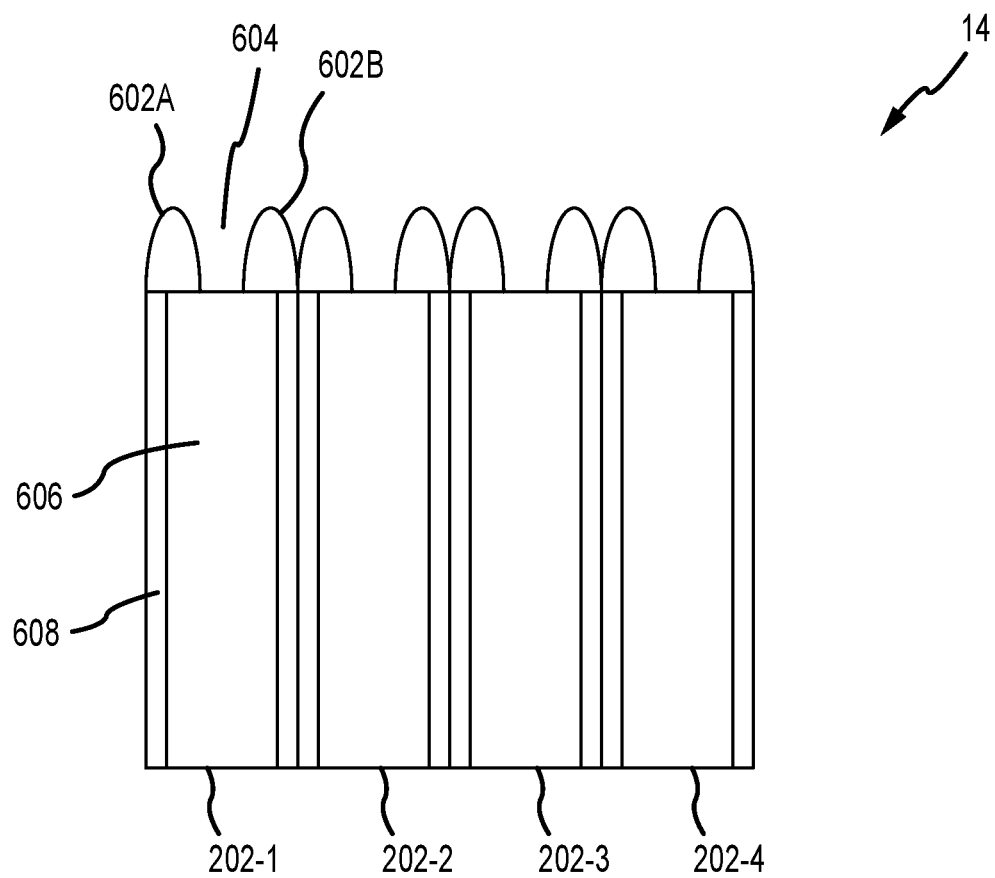
FIG. 6 is a cross-sectional diagram of illustrative SPAD pixels covered with toroidal microlenses in accordance with an embodiment.

As shown in FIG. 6, toroidal microlenses 602 may overlie SPAD pixels 202. In particular, toroidal lenses may focus incident light more effectively than spherical microlenses, resulting in more efficient light detection by the underlying SPAD pixels 202. This is because toroidal lenses may have smaller radii of curvature than spherical microlenses and therefore may focus light onto a smaller area. Toroidal lenses may achieve effective light focusing with thicknesses of less than 10 microns, less than 5 microns, greater than 3 microns, or less than 4 microns. However, this is merely illustrative. In general, toroidal lenses with any desired thicknesses may be used, but toroidal lenses generally require smaller thicknesses than spherical microlenses. Standard microlens manufacturing equipment may be equipped to form microlenses of this thickness, allowing the toroidal microlenses to be formed more efficiently.

In general, SPAD pixels may have active and inactive areas. The active areas may be sensitive to photons in incident light and therefore may be used to determine whether a photon is incident on the SPAD pixels. Conversely, the inactive areas may not be sensitive to light and instead contain circuitry or other material. In some cases, although toroidal lenses may focus light better than spherical lenses, the toroidal lenses may spread light outside of active areas 606. In particular, if toroidal lenses 602 are circular, but the underlying SPAD pixels 202 are square, light that passes through toroidal lenses 602 may be directed outside of active areas 606. For example, microlens portions 602A and 602B may focus some of the light incident on SPAD pixel 202-1 into inactive area 608. This may result in inaccurate determinations as to whether light is incident on SPAD pixel 202-1 and lower the overall efficiency of the SPAD pixel. Therefore, it may be desired to use toroidal lenses that match the shape of the underlying SPAD pixels.

In one embodiment, square toroidal microlenses may be used. The square toroidal lenses may have a square shape that matches the square shape of the underlying SPAD pixels 202. The square toroidal lenses may focus more light onto active areas 606 and therefore be more efficient than circular toroidal lenses (e.g., less light will be focused onto inactive areas 608). In general, however, SPAD pixels 202 may have any desired geometry, and toroidal lenses 602 may have shapes that match that geometry to increase the amount of light that reaches active regions 606.

Figure 7:
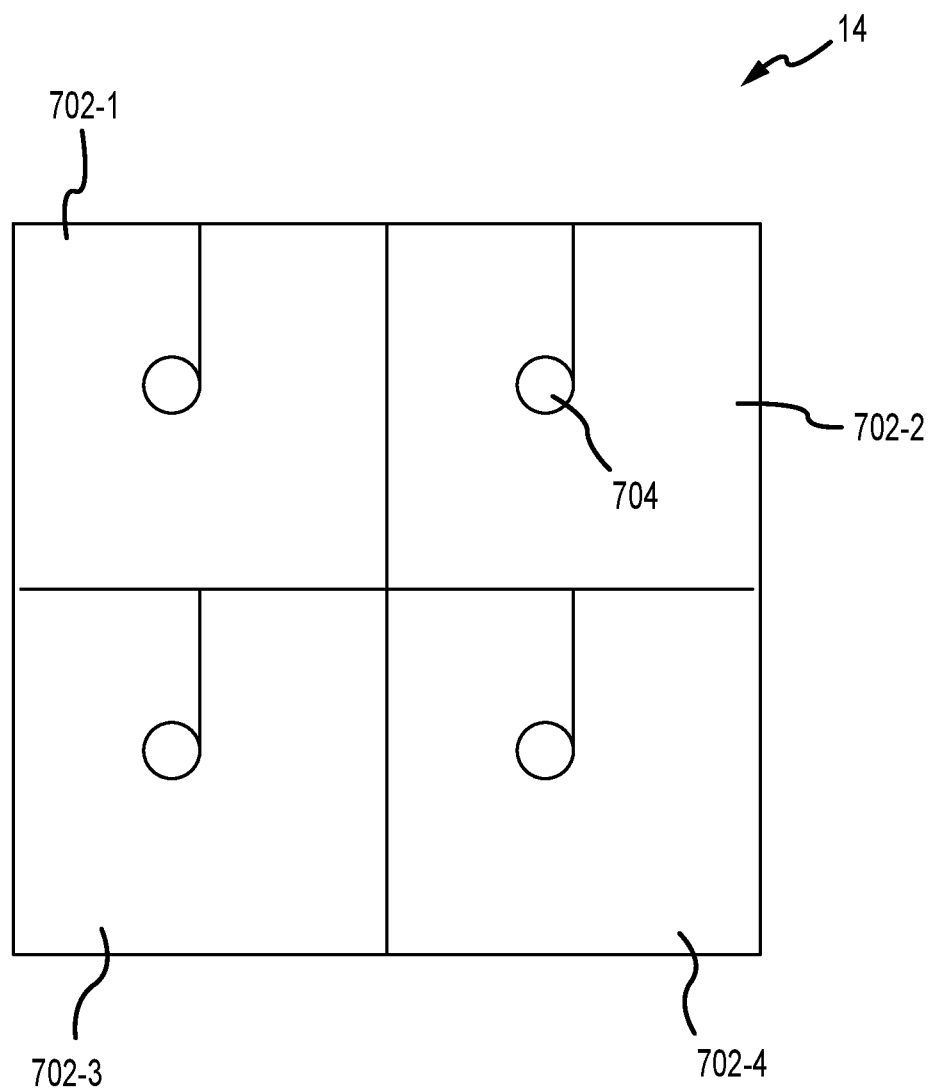
FIG. 7 is a diagram of an illustrative SPAD pixel array covered with square toroidal microlenses in accordance with an embodiment.

As shown in FIG. 7, square toroidal microlenses 702 may be arranged in an array. For example, each square toroidal microlens 702 may overlie a respective one of SPAD pixels 202 (e.g., in SPAD device group 220 of FIG. 2 or in array 120 of FIG. 4). In particular, square toroidal microlenses 702 may be formed over SPAD pixels, such as SPAD pixels 202. As shown in FIG. 7, four square toroidal microlenses may be formed in a grid pattern. The square toroidal microlenses may focus more light onto active areas of the underlying SPAD pixels (e.g., active areas 606 of SPAD pixels 202 in FIG. 6) and therefore efficiently focus light on the underlying pixels.

In general, square toroidal microlenses may have a gap 704 in the center of the microlenses. This is also illustrated by gap 604 in FIG. 6. Moreover, although square toroidal microlenses 702 are shown as having no gaps between any adjacent two microlenses, this is merely illustrative. In general, a mask may be applied to form gaps between adjacent microlenses (e.g., there may be a gap between microlens 702-1 and microlens 702-2, a gap between microlens 702-1 and microlens 702-3, and/or a gap between microlens 702-1 and microlens 702-3). In some cases, it may be desired to remove or fill one or more of the gaps in the center of the square toroidal microlenses or between adjacent square toroidal microlenses to ensure that more of the light incident on the image sensor is directed to the underlying SPAD pixels. Illustrative steps for forming toroidal microlenses and filling gaps in the centers of the microlenses, such as gap 704 in square toroidal microlenses 702, are shown in FIG. 8.

Figure 8:
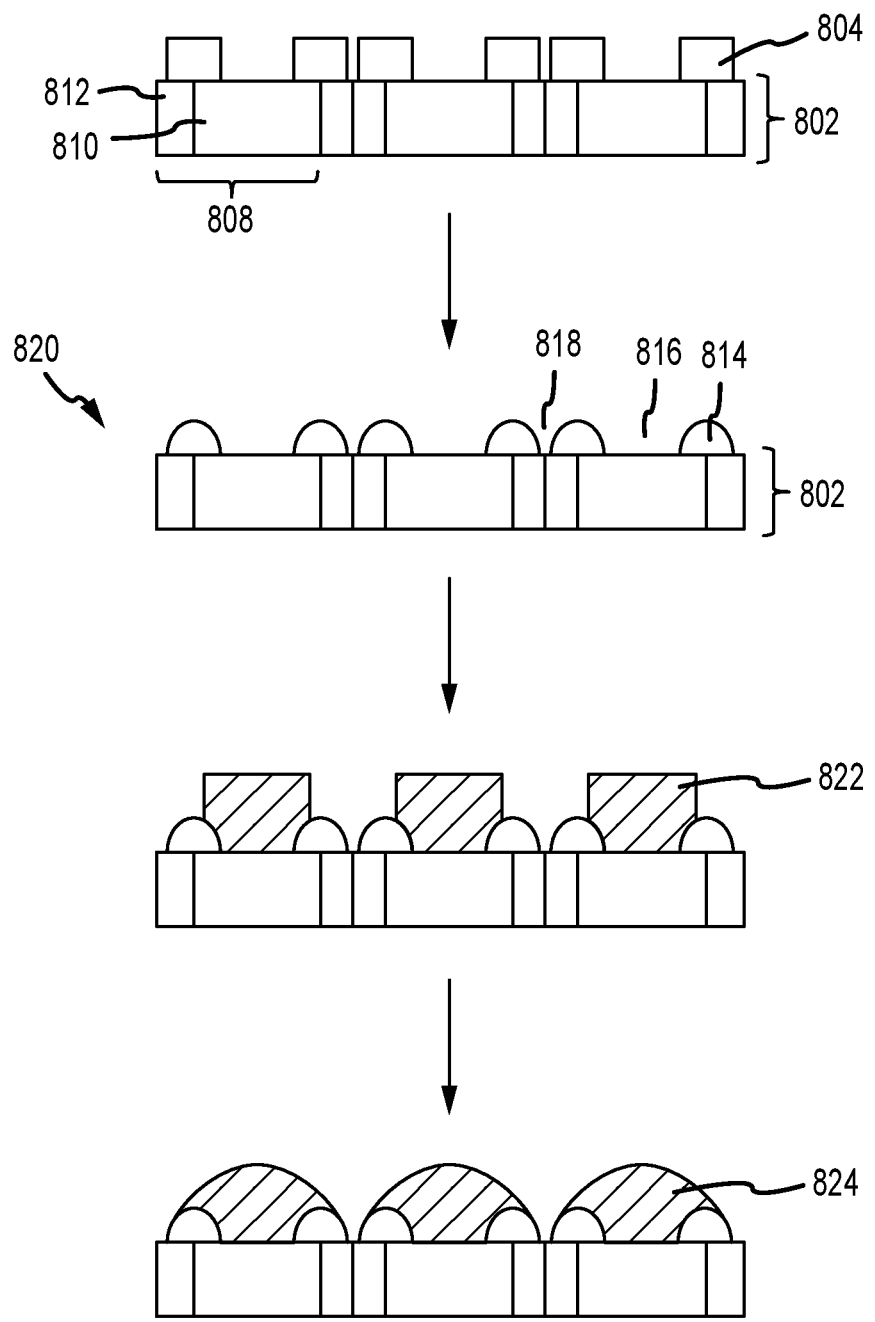
FIG. 8 is a diagram of illustrative steps involved in forming microlenses over SPAD pixels in accordance with an embodiment.

As shown in FIG. 8, wafer 802 may be coated with microlens material 804. Microlens material 804 may be formed from acrylic, silicon, any other desired material, or any desired combination of materials. Wafer 802 may be formed from silicon or any other desired semiconductor material. In general, wafer 802 may have a first portion 810 that corresponds with the active area of SPAD pixel 808 and a second portion 812 that corresponds with the inactive area of SPAD pixel 808. For example, circuitry required in image sensor 14 may be routed over the second portions of wafer 802. Microlens material 804 may be applied over parts of both first portion 810 and second portion 812, as shown in FIG. 8. The microlens material may be applied over the entire wafer 802 in a single step, or the microlens material may be applied to different portions of wafer 802 in multiple steps. In general, the amount and location of microlens material applied to wafer 802 may be adjusted as desired.

After microlens material 804 has been applied to wafer 802, a reflow process may be used to shape the microlens material into toroidal microlens 814. This reflow process may be applied in a single step or may be applied in multiple steps. Toroidal microlens 814 may be a square toroidal microlens, such as square microlens 702-1 of FIG. 7. The curvature of each portion of toroidal microlens 814, as well as the other microlenses formed on wafer 802, may be controlled through the reflow process. For example, it may be desired to have some microlenses with different radii of curvature than other microlenses, or all of the microlenses may have the same curvature. However, this is merely illustrative. In general, any desired microlenses may be formed on wafer 814 through the reflow process.

In some cases, it may be desired to apply square toroidal microlenses (or other toroidal microlenses) over the underlying SPAD pixels. In this case, the process of FIG. 8 may be complete with apparatus 820, which includes microlenses 814 and underlying wafer 802. However, in some cases, it may be desired to fill in gaps in the square toroidal microlenses, such as gaps 816, and/or it may be desired to fill in gaps between adjacent square toroidal microlenses, such as gaps 818.

To fill gaps 816, additional microlens material 822 may be applied in each of gaps 816. Additional microlens material 822 may be formed from the same material as microlens material 804, or it may be formed from different material. For example, additional microlens material 822 may have a higher index of refraction than microlens material 804, which may direct more incident light to the underlying SPAD pixels for detection. However, this is merely illustrative. In general, additional microlens material 822 may have a lower index of refraction than microlens material 804, or additional microlens material 822 may have the same index of refraction as microlens material 804.

After additional microlens material 822 has been applied to wafer 802, an additional reflow process may be used to shape the additional microlens material into microlens 824. As shown in FIG. 8, microlens 824 and toroidal microlens 814 may form a continuously convex shape, which may focus more light toward the active area of an underlying SPAD pixel, such as active area 606 of SPAD pixel 202-1 in FIG. 6, than a conventional toroidal lens. However, this is merely illustrative. In general, the microlens material, the additional microlens material, and the reflow conditions may be adjusted to form any desired microlens shape.

Figure 9A:
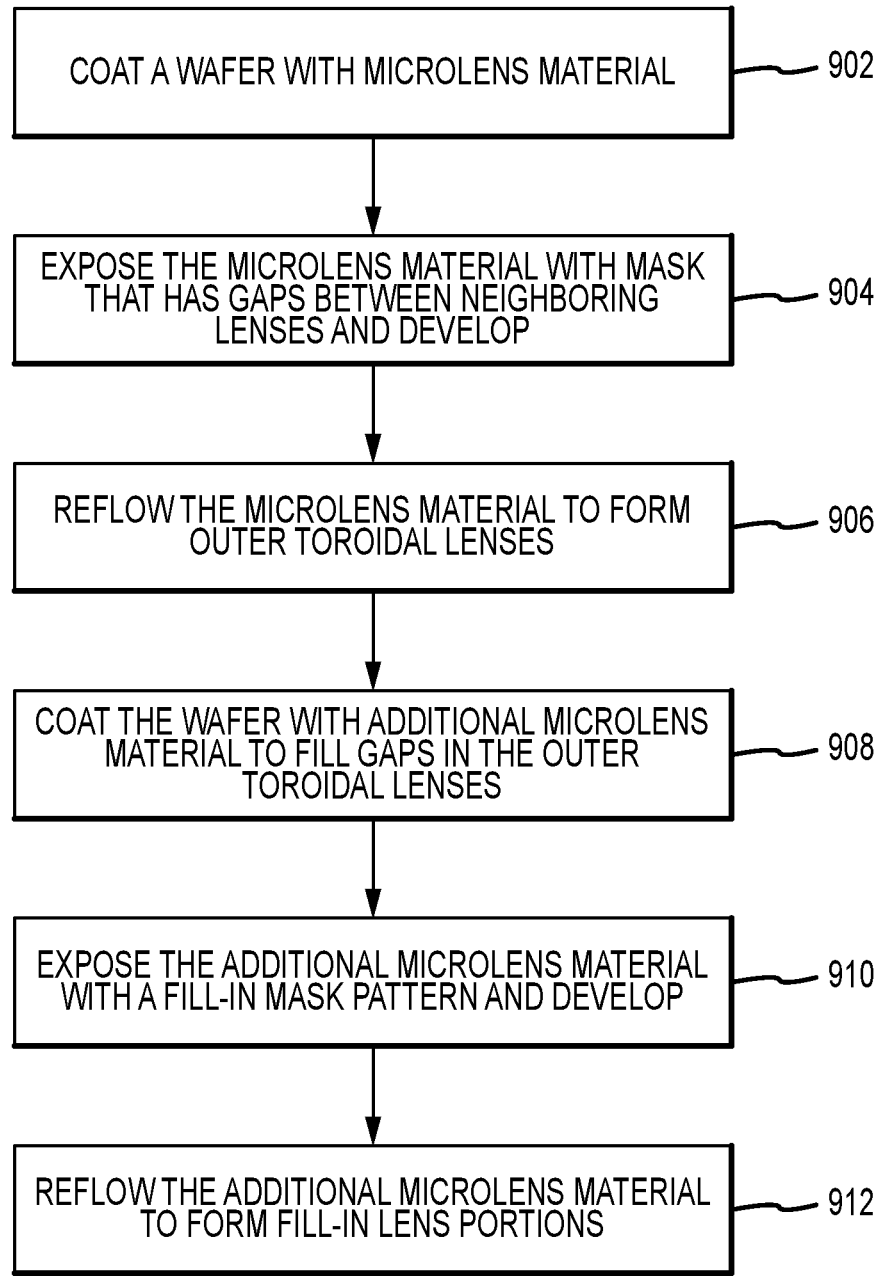
FIG. 9A is a flowchart of method steps for forming microlenses over SPAD pixels using two reflow steps in accordance with an embodiment.

An illustrative method of steps for forming toroidal lenses with filled centers, such as those described above in connection with FIG. 8, is shown in FIG. 9A. At step 902, a wafer, such as a silicon wafer or a wafer formed from other semiconductor material, may be coated with a microlens material. The microlens material may be formed from acrylic, silicon, or any other desired material.

At step 904, the microlens material may be exposed with a mask that has gaps between neighboring lens locations and may be developed. In particular, the mask may have gaps corresponding to gaps 818 of FIG. 8. The gaps may be required to avoid merging between neighboring microlenses. For example, if gaps are not provided, microlens material corresponding to a first microlens may merge with microlens material corresponding to a second microlens that is adjacent to the first microlens. By separating neighboring lenses with gaps, however, all of the microlens material may be reflowed to form microlenses simultaneously.

At step 906, a reflow process may be used to reflow the microlens material to form outer toroidal lenses. The outer toroidal lenses may correspond to toroidal lenses 814 of FIG. 8, for example. In general, the outer toroidal lenses may have any desired shape and/or curvature. In some cases, the outer toroidal lenses may have square shapes to match the shapes of underlying square SPAD pixels to maximize the amount of incident light that reaches active areas of the SPAD pixels. However, this is merely illustrative.

At step 908, the wafer may be coated with additional microlens material to fill gaps in the outer toroidal lenses, such as gaps 816 of FIG. 8. The additional microlens material may be formed from the same material as the microlens material used to form the outer toroidal lenses, or it may be formed from different material. For example, the additional microlens material may have a higher index of refraction than the microlens material used to form the outer toroidal lenses, which may allow more light to be focused on the underlying SPAD pixels for detection. However, this is merely illustrative. In general, the additional microlens material may have a lower index of refraction than the microlens material used to form the outer toroidal lenses, or the additional microlens material may have the same index of refraction as microlens material used to form the outer toroidal lenses.

At step 910, the additional microlens material may be exposed with a fill-in mask pattern and may be developed. The fill-in mask pattern may be adjusted to ensure that the additional microlens material is aligned with the gaps in the outer toroidal lenses and that a desired shape and amount of material is used for each center lens.

At step 912, an additional reflow process may be used to reflow the additional microlens material to form fill-in lens portions (e.g., lens portions that correspond to microlens 824 of FIG. 8). Together, the fill-in lens portions and the outer toroidal lenses may form a continuously convex shape, which may focus light toward the active area of an underlying SPAD pixel, such as active area 606 of SPAD pixel 202-1 of FIG. 6. However, this is merely illustrative. In general, the microlens material, the additional microlens material, and the reflow conditions may be adjusted to form any desired microlens shape.

In general, the method illustrated in FIG. 9A may require gaps between neighboring toroidal microlenses to avoid merging between the microlenses. These gaps may correspond to gaps 818 of FIG. 8, for example. These gaps may be necessary because all of the microlenses are formed simultaneously. In some cases, it may be desired to avoid gaps between neighboring microlenses. For example, it may be desired to form the microlenses to direct light between neighboring pixels into a single one of the pixels, which may increase the efficiency of the array of pixels.

Figure 9B:
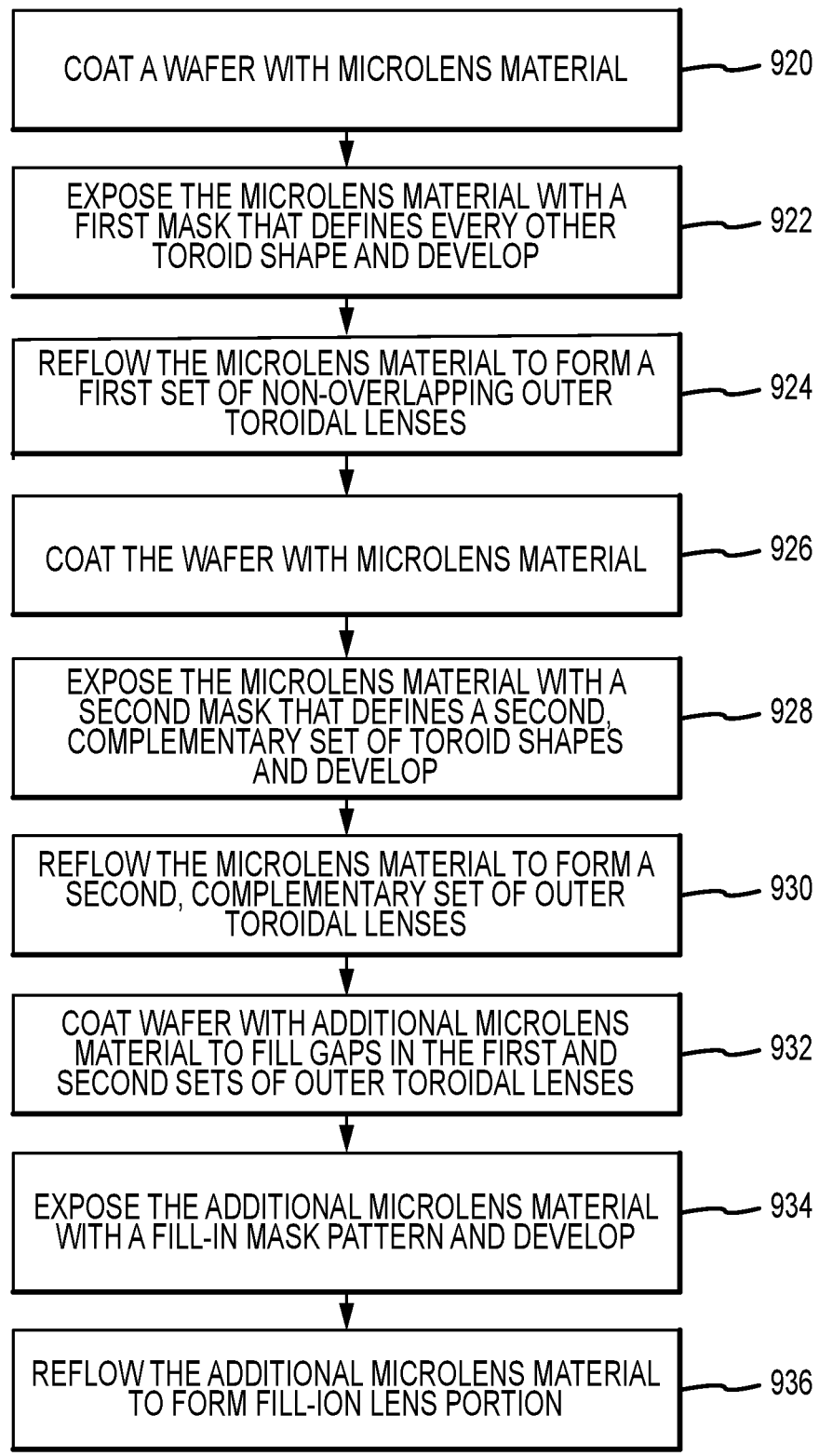
FIG. 9B is a flowchart of method steps for forming microlenses over SPAD pixels using three reflow steps in accordance with an embodiment.

An illustrative method of steps for forming toroidal lens with filled centers and without gaps between neighboring lenses is shown in FIG. 9B. At step 920, a wafer, such as a silicon wafer or a wafer formed from other semiconductor material, may be coated with a microlens material. The microlens material may be formed from acrylic, silicon, or any other desired material.

At step 922, the microlens material may be exposed with a first mask that defines every other toroid shape in the array of lenses, and may be developed. For example, the first mask may define the lens locations that correspond to microlenses 702-1 and 702-4 of FIG. 7. However, first mask may alternatively define the lens locations that correspond to microlenses 702-2 and 702-3. In general, the first mask may define lens locations that correspond with every other lens of the finished array of lenses.

At step 924, a reflow process may be used to reflow the microlens material to form a first set of outer toroidal lenses. The first set of outer toroidal lenses may correspond with outer toroidal lenses 702-1 and 702-4 of FIG. 7, for example. In general, the outer toroidal lenses may have any desired shape and/or curvature. In some cases, the outer toroidal lenses may have square shapes to match the shapes of underlying square SPAD pixels to maximize the amount of incident light that reaches active areas of the SPAD pixels. However, this is merely illustrative.

At step 926, the wafer may be coated with more microlens material. The microlens material may be formed from acrylic, silicon, or any other desired material. Generally, the microlens material may be the same as the microlens material that is used to form the first set of outer toroidal lenses. However, the microlens material may be different, if desired.

At step 928, the microlens material may be exposed with a second mask that defines a second set of toroid shapes that is complementary to the first set of toroid shapes, and may be developed. For example, if the first mask may define the lens locations that correspond to microlenses 702-1 and 702-4 of FIG. 7, the second mask may define the lens locations that correspond to microlenses 702-2 and 702-3. However, second mask may alternatively define the lens locations that correspond to microlenses 702-1 and 702-4. In general, the second mask may define lens locations that are complementary to the first set of outer toroidal lenses.

At step 930, a reflow process may be used to reflow the microlens material to form a second set of outer toroidal lenses. The second set of outer toroidal lenses may correspond with outer toroidal lenses 702-2 and 702-3 of FIG. 7, for example. In general, the outer toroidal lenses may have any desired shape and/or curvature. In some cases, the outer toroidal lenses may have square shapes to match the shapes of underlying square SPAD pixels to maximize the amount of incident light that reaches active areas of the SPAD pixels. However, this is merely illustrative.

Because the first set of outer toroidal lenses and the second set of outer toroidal lenses are formed sequentially (e.g., rather than simultaneously as illustrated in FIG. 9A), gaps between neighboring toroidal lenses, such as gaps 818 of FIG. 8 may be eliminated, if desired. In other words, neighboring toroidal lenses may be in direct contact with one another. Because reflow operations are conducted for the first set of outer toroidal lenses prior to applying the microlens material for the second set of outer toroidal lenses, there may not be a risk of neighboring lenses merging together when reflowing the second set of lenses, and gaps between neighboring lenses may not be necessary.

At step 932, the wafer may be coated with additional microlens material to fill gaps in the outer toroidal lenses, such as gaps 816 in FIG. 8. The additional microlens material may be formed from the same material as the microlens material used to form the first and second sets of outer toroidal lenses, or it may be formed from different material. For example, the additional microlens material may have a higher index of refraction than the microlens material used to form the first and second sets outer toroidal lenses, which may allow more light to reach the underlying SPAD pixels for detection. However, this is merely illustrative. In general, the additional microlens material may have a lower index of refraction than the microlens material used to form the first and second sets of outer toroidal lenses, or the additional microlens material may have the same index of refraction as microlens material used to form the first and second outer toroidal lenses.

At step 934, the additional microlens material may be exposed with a fill-in mask pattern and may be developed. The fill-in mask pattern may be adjusted to ensure that the additional microlens material is aligned with the gaps in the first and second sets of outer toroidal lenses and that a desired shape and amount of material is used for each center lens.

At step 936, an additional reflow process may be used to reflow the additional microlens material to form fill-in lens portions (e.g., lens portions that correspond to microlens 824 of FIG. 8). Together, the fill-in lens portions and the outer toroidal lenses of the first and second sets of outer toroidal lenses may form a continuously convex shape, which may focus light toward the active area of an underlying SPAD pixel, such as active area 606 of SPAD pixel 202-1 in FIG. 6. However, this is merely illustrative. In general, the microlens material, the additional microlens material, and the reflow conditions may be adjusted to form any desired microlens shape.

Figure 10:
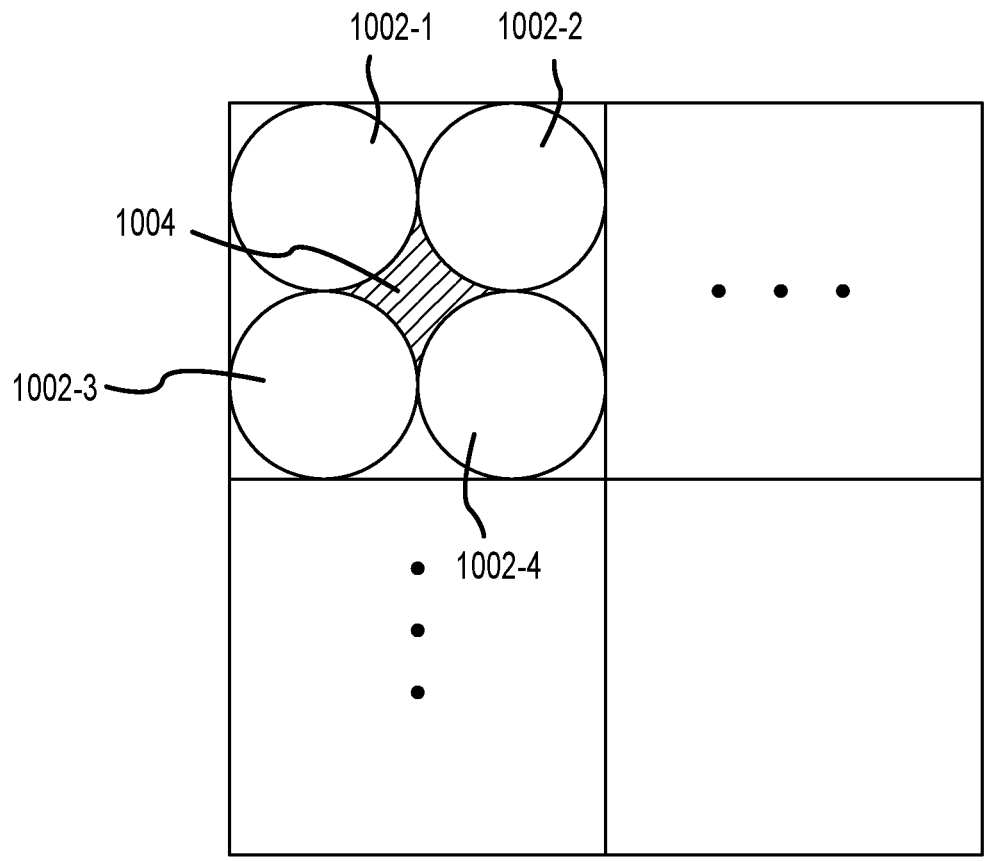
FIG. 10 is a diagram of an illustrative SPAD pixel array covered with spherical microlenses in accordance with an embodiment.

Although the processes illustrated in FIGS. 8 and 9 have been described as filling in gaps in toroidal microlenses, this is merely illustrative. In general, the processes described in FIGS. 8 and 9 may fill gaps in any desired microlenses. For example, as shown in FIG. 10, multiple microlenses may be formed over each SPAD pixel. As shown, spherical microlenses 1002 may be arranged in a two-by-two array over each SPAD pixel. Spherical microlenses 1002 may define a center portion that may be filled by the processes described in connection with FIGS. 8 and 9, thereby forming a continuous, convex shaped microlens that may focus the light effectively on the underlying SPAD pixels.

In any of the aforementioned embodiments, it should be understood that a silicon photomultiplier (with multiple SPAD pixels having a common output) may be used in place of a single SPAD pixel. Each SPAD pixel in the silicon multiplier may be covered by a microlens, or multiple SPAD pixels within the silicon multiplier may be covered by a single microlens, if desired.

Although each of the aforementioned embodiments have been described as applying a microlens over SPAD pixels, the microlenses may be formed over any desired pixel type. For example, the foregoing microlenses may be applied over pixels in conventional CMOS imagers.

In various embodiments of the present invention, a semiconductor device may include a plurality of single-photon avalanche diode pixels, a plurality of first microlenses, at least one of which may cover each of the plurality of single-photon avalanche diode pixels, and a plurality of second microlenses, each of which may fill a gap in the plurality of first microlenses.

In accordance with an embodiment, each first microlens may be a toroidal microlens that has a central opening, and each second microlens may fill a respective one of the central openings in the first microlenses. The plurality of single-photon avalanche diode pixels may each have a first shape, and each of the first microlenses may have a second shape that matches the first shape. In some embodiments, the first shape and the second shape may both be square.

In accordance with an embodiment, each of the first microlenses may be formed from a material having a first index of refraction, and each of the second microlenses may be formed from a material having a second index of refraction that is different from the first index of refraction. The second index of refraction may be higher than the first index of refraction.

In accordance with an embodiment, the first microlenses and the second microlenses may together form a plurality of microlenses, each of which may overlap a respective one of the plurality of single-photon avalanche diode pixels. Alternatively or additionally, the first microlenses and the second microlenses may be at least partially formed from the same material.

In accordance with an embodiment, the first microlenses may be spherical microlenses, and the spherical microlenses may be formed in a two-by-two array over each single-photon avalanche diode pixel. The second microlenses may fill the gap between the four spherical microlenses over each pixel.

In accordance with an embodiment, the first microlenses may be square toroidal microlenses, and adjacent first microlenses may be in direct contact with one another. The second microlenses may fill center gaps in the square toroidal microlenses.

In accordance with various embodiments, microlenses may be formed over a plurality of single-photon avalanche diodes by applying first microlens material over a semiconductor wafer, exposing the first microlens material with a first mask, reflowing the first microlens material to form a first set of non-overlapping outer toroidal microlenses, applying second microlens material over the semiconductor wafer, exposing the second microlens material with a second mask, and reflowing the second microlens material to form a second set of complementary outer toroidal microlenses.

In accordance with an embodiment, exposing the first microlens material with the first mask and reflowing the first microlens material may form a first set of square toroidal microlenses, and exposing the second microlens material with the second mask and reflowing the second microlens material may form a second set of square toroidal microlenses. The second microlens material may be applied after reflowing the first microlens material, if desired.

In accordance with an embodiment, the microlens may be further formed by applying additional microlens material over the semiconductor wafer, exposing the additional microlens material with a fill-in mask, and reflowing the additional microlens material to form fill-in lens portions. The additional microlens material may fill openings in the first and second sets of outer toroidal microlenses. Moreover, the fill-in lens portions and the first and second sets of outer toroidal microlenses may form a plurality of convex microlenses over the plurality of SPAD pixels.

In accordance with an embodiment, the first microlens material and the second microlens material may be applied over the entire semiconductor wafer, and the first and second microlens material may be exposed and reflowed after both sets of material have been applied.

In accordance with various embodiments, a semiconductor device may include a single-photon avalanche diode pixel, a toroidal microlens over the single-photon avalanche diode pixel having a central opening, and a fill-in microlens that fills the central opening of the toroidal microlens.

In accordance with an embodiment, the single-photon avalanche diode pixel may have a square shape and the toroidal microlens may be a square toroidal microlens. The square toroidal microlens may have a first index of refraction and the fill-in microlens may have a second index of refraction that is higher than the first index of refraction.

The foregoing is merely illustrative of the principles of this invention and various modifications can be made by those skilled in the art. The foregoing embodiments may be implemented individually or in any combination.

What is claimed is:

1. A semiconductor device comprising:
   a plurality of single-photon avalanche diode pixels;
   a plurality of first microlenses, wherein at least one of the first microlenses covers each of the plurality of single-photon avalanche diode pixels, each first microlens has a first surface, and the first microlenses are square toroidal microlenses; and
   a plurality of second microlenses, wherein each second microlens fills a gap in the plurality of first microlenses, each second microlens has a second surface that is coplanar with the first surface, and the first microlenses and second microlenses together form a plurality of convex microlenses.

2. The semiconductor device defined in claim 1 wherein each of the convex microlenses overlaps a respective one of the plurality of single-photon avalanche diode pixels.

3. The semiconductor device defined in claim 1 wherein the first microlenses have a first index of refraction and wherein the second microlenses have a second index of refraction that is different from the first index of refraction.

4. The semiconductor device defined in claim 1 wherein each of the second microlenses has a square shape.

5. The semiconductor device defined in claim 1 wherein each of the single-photon avalanche diode pixels has a square shape.

6. The semiconductor device defined in claim 1 wherein adjacent first microlenses are in direct contact with one another, and wherein the second microlenses fill center gaps in the square toroidal microlenses.

7. A semiconductor device comprising:
   a single-photon avalanche diode pixel;
   a first microlens over the single-photon avalanche diode pixel, wherein the first microlens has a central opening; and
   a second microlens that fills the central opening of the first microlens, wherein a portion of the first microlens is interposed between a portion of the second microlens and the single-photon avalanche diode pixel.

8. The semiconductor device defined in claim 7 wherein the first microlens has a first surface and the second microlens has a second surface that is coplanar with the first surface.

9. The semiconductor device defined in claim 7 wherein the first microlens extends a first distance over the single-photon avalanche diode pixel, the second microlens extends a second distance over the single-photon avalanche diode pixel, and the second distance is greater than the first distance.

10. The semiconductor device defined in claim 7 wherein the first microlens is formed from a first material and the second microlens is formed from a second material that is different from the first material.

11. The semiconductor device defined in claim 10 wherein the first material has a first index of refraction and the second material has a second index of refraction that is greater than the first index of refraction.

12. The semiconductor device defined in claim 7 wherein the first microlens is a toroidal microlens.

13. The semiconductor device defined in claim 12 wherein the toroidal microlens has a thickness of less than 10 microns.

14. The semiconductor device defined in claim 7 wherein the first microlens is a spherical microlens.

15. A semiconductor device comprising:
   a plurality of single-photon avalanche diode pixels, wherein each of the single-photon avalanche diode pixels has a center;
   a plurality of first microlenses, wherein at least one of the first microlenses covers each of the plurality of single-photon avalanche diode pixels; and
   a plurality of second microlenses, wherein each second microlens fills a gap in a respective one of the plurality of first microlenses, each second microlens and the respective one of the plurality of first microlenses together overlap a respective single-photon avalanche diode pixel, and each of the first and second microlenses are configured to redirect light toward the center of the respective single-photon avalanche diode pixel.

16. The semiconductor device defined in claim 15 wherein each of the first microlenses is a toroidal microlens, and the first microlenses and second microlenses together form a plurality of convex microlenses.

17. The semiconductor device defined in claim 15 wherein the first and second microlenses have a thickness less than 10 microns.

18. The semiconductor device defined in claim 17 wherein each of the first microlenses is a square toroidal microlens, and each of the second microlenses fills an opening in a center of each first microlens.

* * * * *